(12) United States Patent
Kobayashi et al.

(10) Patent No.: US 8,866,284 B2
(45) Date of Patent: Oct. 21, 2014

(54) SEMICONDUCTOR DEVICE COMPRISING AN EXTENDED SEMICONDUCTOR CHIP HAVING AN EXTENSION

(71) Applicant: Panasonic Corporation, Osaka (JP)

(72) Inventors: Shouichi Kobayashi, Kyoto (JP); Hiroaki Suzuki, Hyogo (JP); Kazuhide Uriu, Osaka (JP); Koichi Seko, Osaka (JP); Takashi Yui, Shiga (JP); Kiyomi Hagihara, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/938,330

(22) Filed: Jul. 10, 2013

(65) Prior Publication Data

US 2013/0299957 A1    Nov. 14, 2013

Related U.S. Application Data

(63) Continuation of application No. PCT/JP2011/004346, filed on Jul. 29, 2011.

(30) Foreign Application Priority Data

Feb. 10, 2011    (JP) ................. 2011-027134

(51) Int. Cl.
*H01L 23/48* (2006.01)
*H01L 23/52* (2006.01)
(Continued)

(52) U.S. Cl.
CPC ........ *H01L 23/293* (2013.01); *H01L 23/49575* (2013.01); *H01L 2224/32225* (2013.01); *H01L 2224/73207* (2013.01); *H01L 2224/32245* (2013.01); *H01L 23/495* (2013.01); *H01L 2224/73265* (2013.01); *H01L 2224/04042* (2013.01); *H01L 23/5389* (2013.01);
(Continued)

(58) Field of Classification Search
CPC ................. H01L 24/76; H01L 23/4824; H01L 2224/48135; H01L 2224/49174; H01L 25/0657; H01L 23/293
USPC .................................................. 257/692, 735
See application file for complete search history.

(56) References Cited

U.S. PATENT DOCUMENTS 6,133,637 A    10/2000    Hikita et al.
6,458,609 B1    10/2002    Hikita et al.
(Continued)

FOREIGN PATENT DOCUMENTS

JP        6-209071        7/1994
JP        10-335576        12/1998
(Continued)

OTHER PUBLICATIONS

International Search Report of PCT Application No. PCT/JP2011/004346 dated Oct. 18, 2011.

*Primary Examiner* — William D Coleman
(74) *Attorney, Agent, or Firm* — McDermott Will & Emery LLP

(57) ABSTRACT

A semiconductor device includes a first extended semiconductor chip including a first semiconductor chip and an extension extending outwardly from a side surface of the first semiconductor chip. The semiconductor device also includes a second semiconductor chip mounted above the first extended semiconductor chip and electrically connected with the first semiconductor chip. The first extended semiconductor chip includes a first extension electrode pad provided above the extension and electrically connected with an electrode of the first semiconductor chip.

21 Claims, 8 Drawing Sheets

(51) Int. Cl.
*H01L 23/495* (2006.01)
*H01L 23/538* (2006.01)
*H01L 29/06* (2006.01)
*H01L 23/29* (2006.01)
*H01L 25/065* (2006.01)
*H01L 25/00* (2006.01)

(52) U.S. Cl.
CPC ... *H01L 2225/06513* (2013.01); *H01L 29/0657*
(2013.01); *H01L 2224/48227* (2013.01); *H01L*
*2225/06506* (2013.01); *H01L 2224/04105*
(2013.01); *H01L 2225/0651* (2013.01); *H01L*
*2224/16145* (2013.01); *H01L 2225/06568*
(2013.01); *H01L 2224/48247* (2013.01); *H01L*
*2224/32145* (2013.01); *H01L 25/0657*
(2013.01); *H01L 25/50* (2013.01); *H01L*
*2924/15311* (2013.01); *H01L 2224/73204*
(2013.01)
USPC ........................................ 257/692; 257/735

(56) References Cited

U.S. PATENT DOCUMENTS

| | | | |
|---|---|---|---|
| 7,230,330 B2 * | 6/2007 | Lee et al. | ........................ 257/686 |
| 2002/0027295 A1 | 3/2002 | Kikuma et al. | |
| 2005/0121802 A1 | 6/2005 | Kawano et al. | |
| 2006/0163728 A1 | 7/2006 | Nakanishi et al. | |
| 2010/0087033 A1 | 4/2010 | Mizoguchi et al. | |
| 2010/0327434 A1 | 12/2010 | Yajima | |
| 2011/0057327 A1 | 3/2011 | Yoshida et al. | |

FOREIGN PATENT DOCUMENTS

| | | |
|---|---|---|
| JP | 11-163051 | 6/1999 |
| JP | 11-177020 | 7/1999 |
| JP | 2002-118208 | 4/2002 |
| JP | 2002-164632 | 6/2002 |
| JP | 2005-93943 | 4/2005 |
| JP | 2006-203079 | 8/2006 |
| JP | 2010-92931 | 4/2010 |
| JP | 2010-141080 | 6/2010 |
| JP | 2010-166100 | 7/2010 |

* cited by examiner

SEMICONDUCTOR DEVICE COMPRISING AN EXTENDED SEMICONDUCTOR CHIP HAVING AN EXTENSION

CROSS-REFERENCE TO RELATED APPLICATIONS

This is a continuation of International Application No. PCT/JP2011/004346 filed on Jul. 29, 2011, which claims priority to Japanese Patent Application No. 2011-027134 filed on Feb. 10, 2011. The entire disclosures of these applications are incorporated by reference herein.

BACKGROUND

The present disclosure relates to semiconductor devices, and more particularly to a semiconductor device fabricated by stacking chips using a chip-on-chip technique.

With enhanced capabilities of digital televisions, recorders, etc., systems thereof have dealt with a dramatically increased amount of data. Therefore, semiconductor memories installed in these systems need not only increased capacities but also higher data transfer rates. For installation in a system requiring many semiconductor memories, a semiconductor device including a combination of a semiconductor logic circuit and a memory is under development. This semiconductor logic circuit includes a memory controller. A logic circuit and a memory are combined together as a system on chip (SoC), which integrates a semiconductor logic circuit chip and a memory into a single chip, or a system in package (SiP), where a logic circuit chip and a memory chip are stacked in a single package.

Currently, there is a tendency for systems with SiPs to increase in popularity because the cost of manufacturing of SiPs is relatively low. An SiP uses the chip-on-chip (CoC) technique for directly connecting chips by flip-chip bonding through micro bumps etc. to increase a data transfer rate between a semiconductor memory and a semiconductor logic circuit chip (see, e.g., Japanese Patent Publication No. 2010-141080).

SUMMARY

However, in conventional techniques, the order of stacking of chips depends on the chip sizes. In stacking a semiconductor memory and a logic circuit chip, because of the size difference between the semiconductor memory and the logic circuit chip, the semiconductor memory larger than the semiconductor logic circuit chip needs to be located in the lower side, and the semiconductor logic circuit chip smaller than the semiconductor memory needs to be located in the upper side. Thus, if a logic circuit chip is larger than a memory chip, the conventional techniques cannot build the CoC structure.

Additionally, in conventional techniques, a semiconductor device needs a special memory chip that includes, in a memory interconnect layer, interconnection between an external connection terminal and a semiconductor memory terminal, and thus can be used for limited purposes.

It is a problem of the present disclosure to solve the above-described problems, to remove the constraint of the size differences among a plurality of semiconductor chips that are stacked together, and to provide a semiconductor device without a semiconductor chip including special wiring.

To solve the problem, the semiconductor device of the present disclosure includes an extended semiconductor chip including an extension made of a resin etc., and disposed on a periphery of a semiconductor chip. Wire bonding terminals are disposed on the extension.

Specifically, an example semiconductor device includes a first extended semiconductor chip including a first semiconductor chip and an extension extending outwardly from a side surface of the first semiconductor chip. The semiconductor device also includes a second semiconductor chip mounted above the first extended semiconductor chip and electrically connected with the first semiconductor chip. The first extended semiconductor chip includes a first extension electrode pad provided above the extension and electrically connected with an electrode of the first semiconductor chip.

In the semiconductor device, the extension may be made of an insulating material covering the side surface of the first semiconductor chip.

In the semiconductor device, the first extended semiconductor chip and the second semiconductor chip may be connected with each other through bumps.

The semiconductor device may further include a wiring board having a top surface on which the first extended semiconductor chip is mounted. The wiring board and the first extended semiconductor chip are bonded with each other by an adhesive layer. The first extension electrode pad is electrically connected with a board electrode pad disposed on the top surface of the wiring board.

The semiconductor device may further include a flat bonding layer disposed between the first extended semiconductor chip and the wiring board.

In the semiconductor device, the extension electrode pad and the board electrode pad may be connected with each other through a metal wire.

The semiconductor device may further include an encapsulating resin encapsulating the first extended semiconductor chip, the second semiconductor chip, and the metal wire.

The semiconductor device may further include a lead frame including a chip mounting portion on which the first extended semiconductor chip is mounted, and a lead. The lead frame and the first extended semiconductor chip are bonded with each other by an adhesive layer. The extension electrode pad is electrically connected with the lead through a metal wire.

The semiconductor device may further include a flat bonding layer disposed between the first extended semiconductor chip and the chip mounting portion.

In the semiconductor device, the extension electrode pad and the lead may be connected with each other through a metal wire.

The semiconductor device may further include an encapsulating resin encapsulating the first extended semiconductor chip, the second semiconductor chip, and the lead frame. The lead frame may include an outside connect terminal exposed from a back surface of the encapsulating resin.

In the semiconductor device, the bonding layer may be made of a metal, glass, or silicon.

In the semiconductor device, each side of the first extended semiconductor chip may be parallel with the corresponding side of the second semiconductor chip, and one side of the first extended semiconductor chip may be longer than the corresponding side of the second semiconductor chip.

In the semiconductor device, each side of the first extended semiconductor chip may be parallel with the corresponding side of the second semiconductor chip, and a periphery of the first extended semiconductor chip may not be covered by the second semiconductor chip.

In the semiconductor device, the spacing between one side of the first extended semiconductor chip and the corresponding side of the second semiconductor chip may be more than or equal to 500 µm.

In the semiconductor device, each side of the first extended semiconductor chip may be parallel with the corresponding side of the second semiconductor chip, and one side of the first extended semiconductor chip may be shorter than the corresponding side of the second semiconductor chip.

In the semiconductor device, each side of the first extended semiconductor chip may be parallel with the corresponding side of the second semiconductor chip, and the spacing between one side of the first extended semiconductor chip and the corresponding side of the second semiconductor chip may be less than 500 µm.

In the semiconductor device, an interface between the extension and the first semiconductor chip may be raised and recessed.

In the semiconductor device, the side surface of the first semiconductor chip in contact with the extension may have a plurality of surfaces having different tilt angles.

The semiconductor device may further include a second extended semiconductor chip including a third semiconductor chip and an extension extending outwardly from a side surface of the third semiconductor chip, and a wiring board. The second extended semiconductor chip may be bonded on a top surface of the wiring board by an adhesive layer. The first extended semiconductor chip may be mounted above the second extended semiconductor chip. A second extension electrode pad disposed above the extension of the second extended semiconductor chip may be electrically connected with a board electrode pad disposed on a top surface of the wiring board.

The semiconductor device of the present disclosure can remove the constraint of the size differences among a plurality of semiconductor chips that are stacked together, and may not require a semiconductor chip including special wiring.

DETAILED DESCRIPTION

Figure 1:
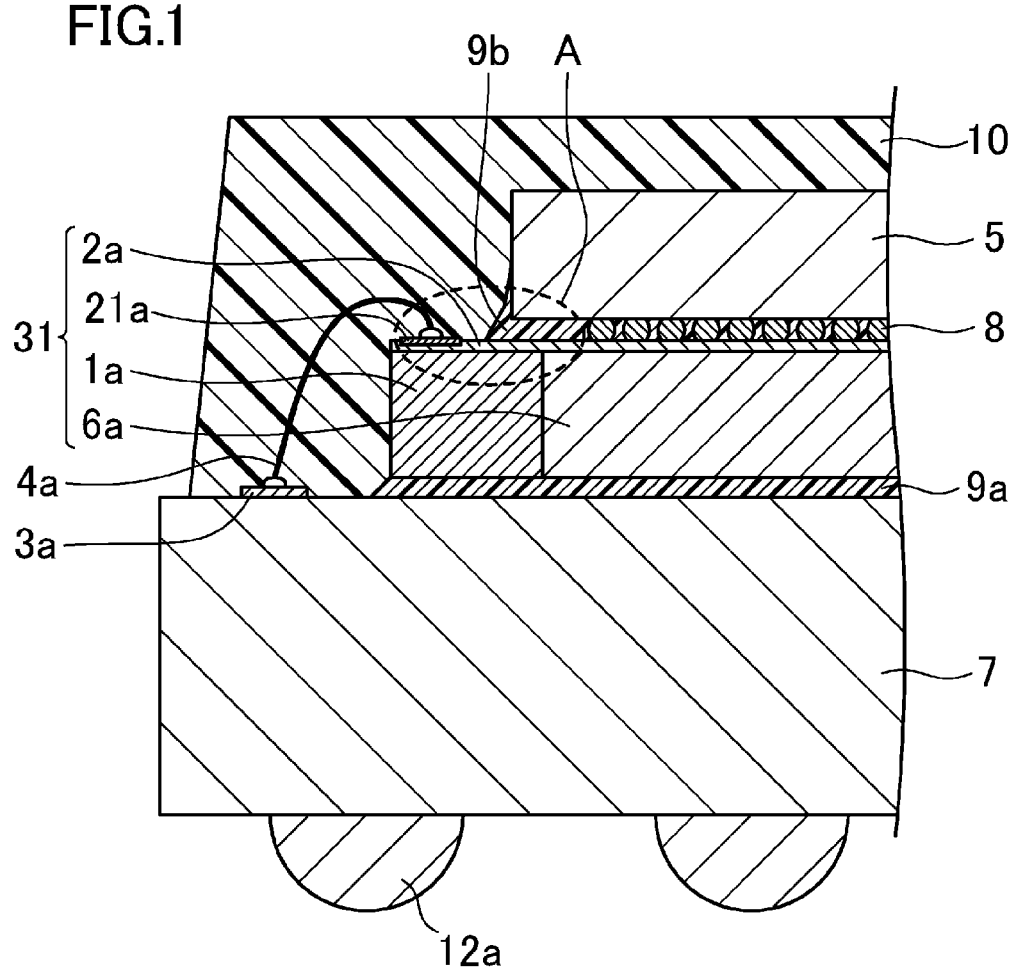
FIG. 1 is a sectional view of a semiconductor device of a first embodiment.

A semiconductor device can be embodied in various ways. For example, a semiconductor device of the present disclosure may include a first extended semiconductor chip, a second semiconductor chip, and a first extension electrode pad. The first extended semiconductor chip includes a first semiconductor chip and an extension extending outwardly from a side surface of the first semiconductor chip. The second semiconductor chip is mounted above the first extended semiconductor chip, and electrically connected with the first semiconductor chip. The first extension electrode pad is provided above the extension, and electrically connected with an electrode of the first semiconductor chip.

A plurality of semiconductor chips, each of which includes an extension provided on a periphery of the semiconductor chip, can be mounted above a semiconductor package. A plurality of wire bonding terminals can be disposed in rows on the extensions provided on the periphery of the semiconductor chip, and electrically connect the extensions with each other.

A plurality of stacked semiconductor chips may be mounted above a lead frame instead of a wiring board. This configuration can adopt low cost materials.

The extension provided on the periphery of the semiconductor chip can cover not only the side surface of the semiconductor chip but also at least one of the top or bottom surface of the semiconductor chip.

The boundary between the extension provided on the periphery of the semiconductor chip and the semiconductor chip may be raised and recessed. Alternatively, the side surface of the semiconductor chip may be tilted with respect to the vertical direction. These configurations increase a bonding area between the semiconductor chip and the extension, and improve the bonding strength therebetween.

A wiring layer that electrically connects the wire bonding terminal with the semiconductor chip may be disposed on the entire surface or a part of the surface of the semiconductor chip.

The first semiconductor chip may be extended in the following manner. The first and second semiconductor chips are mounted on the mutually different surfaces of the wiring board including a wiring layer. One surface of the wiring board includes the wire bonding terminal. The first semiconductor chip is covered and encapsulated by a resin. The wire bonding terminal of the wiring board is electrically connected with a wiring board etc. of the semiconductor package through a wire.

A bendable, flexible wiring board can connect the semiconductor chips with each other, and can electrically connect the semiconductor package with the semiconductor chips. Such a wiring board may cover the entire surface or a part of the surface of the semiconductor chips.

The semiconductor device may include a rewiring board of which one surface includes wire bonding terminals. The semiconductor device may include a semiconductor chip that is connected to the rewiring board. The semiconductor device may include a stacked semiconductor chip. The semiconductor device may include a semiconductor package wiring board that includes balls.

The semiconductor device may include an alternative rewiring board. A semiconductor chip can be mounted on both surfaces of the rewiring board. One surface of the rewiring board includes bonding terminals. The rewiring board is larger than the mounted semiconductor chip. The semiconductor device may also include a plurality of semiconductor chips that are mounted above the rewiring board. The semiconductor device may also include a semiconductor package wiring board that connects to the outside of the semiconductor. The semiconductor chip may be electrically connected to one side of the rewiring board through bumps, and encapsulated by a resin. The other semiconductor chip may be electrically connected to the encapsulated rewiring board through bumps. The wire bonding terminals of the rewiring board and the semiconductor package are electrically connected with each other through a wire.

In this semiconductor device, in a case where an upper semiconductor chip of the semiconductor package with a CoC structure is larger than a lower semiconductor chip, the lower semiconductor chip can be connected with a semiconductor package external terminal through a wire. In addition, it is not necessary to install wiring on the stacked semiconductor chips by a special semiconductor process, and thus the stacked semiconductor chips are not limited.

(First Embodiment)

FIG. 1 illustrates a cross-sectional configuration of a semiconductor device (a stacked semiconductor package) of a first embodiment. An extended semiconductor chip 31 includes a first chip 6a, which serves as a logic circuit chip. The extended semiconductor chip 31 also includes an extension 1a, which is made of a resin, and disposed on a periphery of the first chip 6a. An extension electrode pad 21a, which serves as a wire bonding terminal, is disposed above the extension 1a. The extension electrode pad 21a is electrically connected through a rewiring portion 2a with an electrode provided on the first chip 6a. A second chip 5, which serves as a memory chip, is provided above the extended semiconductor chip 31. The extended semiconductor chip 31 and the second chip 5 are disposed so that one side of the extended semiconductor chip 31 is substantially parallel with the corresponding side of the second chip 5. The extension 1a is disposed so that a flat surface of the extended semiconductor chip 31 is larger than that of the second chip 5. Specifically, each side of the extended semiconductor chip 31 is longer than the corresponding side of the second chip 5. Alternatively, each side of the extended semiconductor chip 31 may be longer than any side of the second chip 5.

A terminal (not shown) provided on a top surface of the first chip 6a and a terminal (not shown) provided on a bottom surface of the second chip 5 are electrically bonded with each other through bumps 8. In general, the terminal disposed on the top surface of the first chip 6a is connected with a terminal disposed on a top surface of the rewiring portion 2a through wiring disposed in the rewiring portion 2a, and the terminal disposed on the top surface of the rewiring portion 2a is connected with the bumps 8. However, it is not necessary for the rewiring portion 2a to be disposed on the entire surfaces of the first chip 6a and the extension 1a. The top surface of the first chip 6a may be exposed in a central portion of the extended semiconductor chip 31 so that the second chip 5 is mounted directly on the first chip 6a.

An underfill material 9b is filled between the second chip 5 and the extended semiconductor chip 31, and a bonding portion between the second chip 5 and the extended semiconductor chip 31 is fixed. A stack of the extended semiconductor chip 31 and the second chip 5 is fixed on the wiring board 7 by an underfill material 9a, which serves as an adhesive layer. The wiring board 7 is, for example, a resin board. A board electrode pad 3a, which serves as a wire bonding pad, is disposed on a top surface of the wiring board 7. The extension electrode pad 21a and the board electrode pad 3a are electrically connected with each other through a wire 4a. Package balls 12a are disposed on a bottom surface of the wiring board 7, and can be electrically connected the outside of the semiconductor device. The stack of the chips is encapsulated by an encapsulating resin 10, and serves as a stacked semiconductor package with a CoC structure. Note that the wiring board 7 may be replaced with a lead frame etc.

Figure 2:
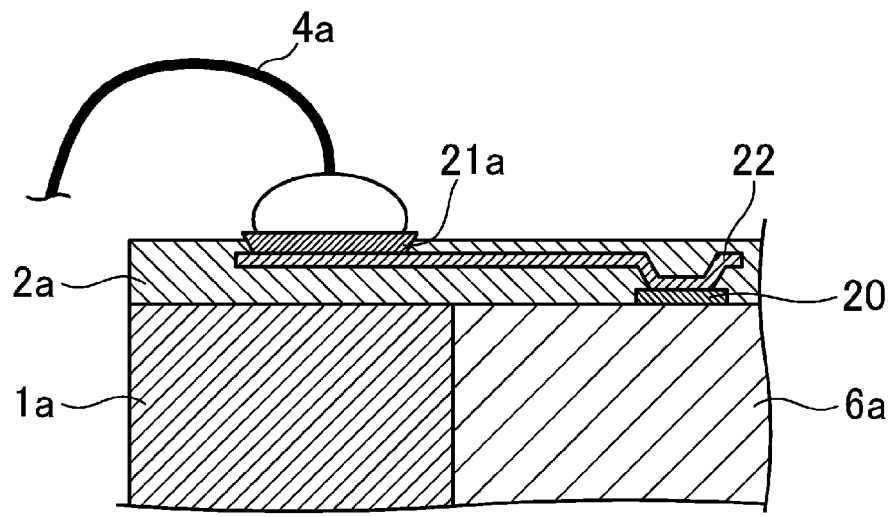
FIG. 2 is an enlarged sectional view of a portion A in FIG. 1.

FIG. 2 is an enlarged view of a portion A in FIG. 1. An electrode 20 electrically connected with various elements in the first chip 6a is disposed on the top surface of the first chip 6a. The rewiring portion 2a including a rewiring 22 is disposed, covering the top surface of the first chip 6a and a top surface of the extension 1a. The extension electrode pad 21a is disposed on the rewiring portion 2a of the extension 1a. The electrode 20 and the extension electrode pad 21a are electrically connected with each other through the rewiring 22. Therefore, the semiconductor device of this embodiment can have the stacked CoC structure regardless of the plane sizes of the stacked semiconductor chips. In FIG. 2, one layer of the rewiring portion 2a is disposed. Alternatively, multiple layers of the rewiring portions 2a may be disposed.

Figure 3:
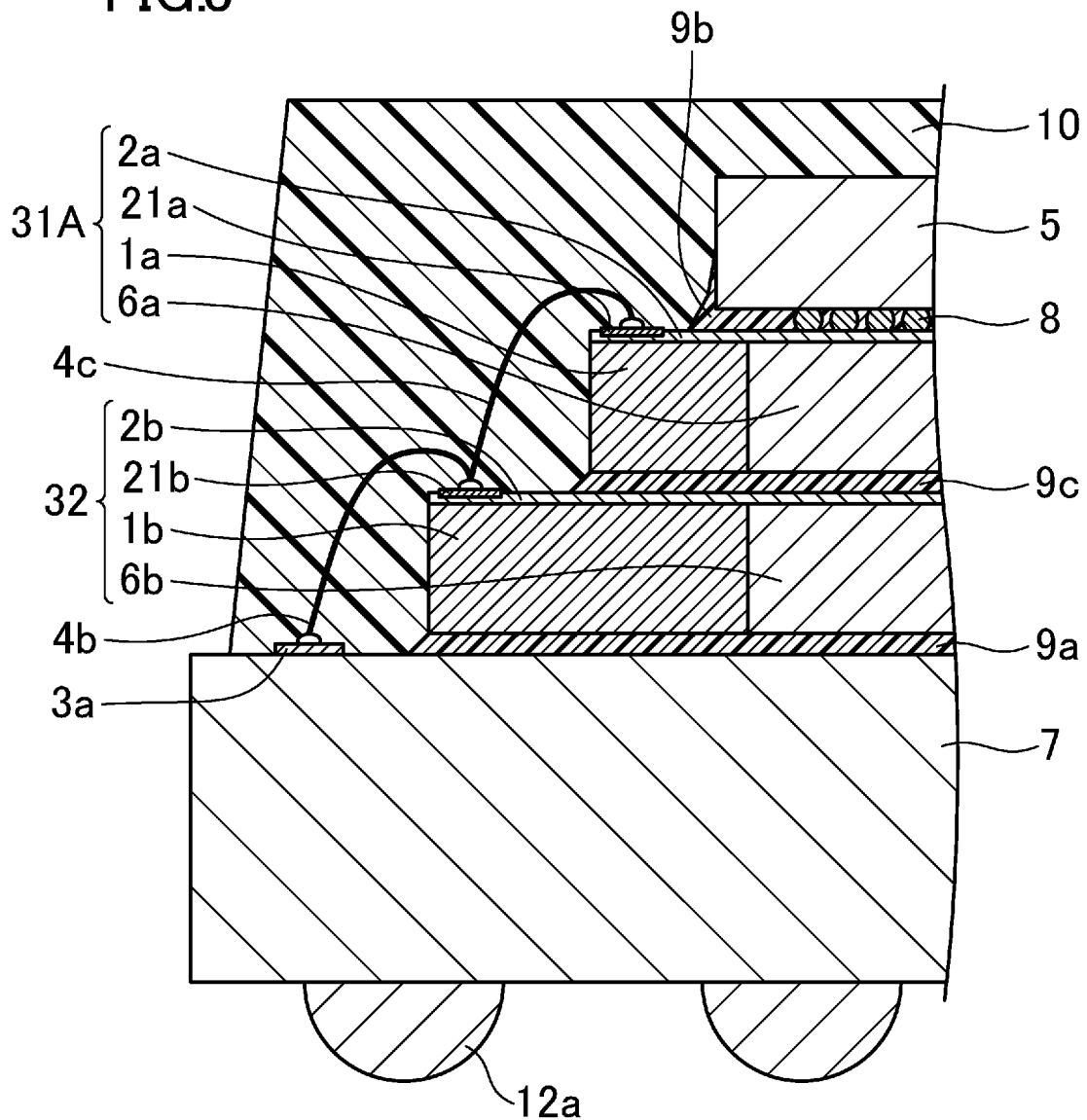
FIG. 3 is a sectional view illustrating an alternative example of the semiconductor device of the first embodiment.

FIG. 1 illustrates the example where one extended semiconductor chip is disposed. Alternatively, as illustrated in FIG. 3, a plurality of extended semiconductor chips may be stacked. A first extended semiconductor chip 31A includes the first chip 6a and the extension 1a, which is made of a resin, and disposed on the periphery of the first chip 6a. Similarly to FIG. 1, the second chip 5 is stacked above the first extended semiconductor chip 31A. The first extended semiconductor chip 31A and the second chip 5 are stacked above a second extended semiconductor chip 32. The second extended semiconductor chip 32 includes a third chip 6b and an extension 1b. The extension 1b is disposed so that the plane size of the second extended semiconductor chip 32 is larger than that of the first extended semiconductor chip 31A. An extension electrode pad 21b is disposed above the extension 1b. Similarly to the first extended semiconductor chip 31A, the extension electrode pad 21b is connected through a rewiring portion 2b with an electrode of the third chip 6b. An underfill material 9c is implanted on an interface between the first extended semiconductor chip 31A and the second extended semiconductor chip 32. The extension electrode pad 21a and the extension electrode pad 21b are electrically connected with each other through a wire 4c. The extension electrode pad 21b and the board electrode pad 3a disposed on the top surface of the wiring board 7 are electrically connected with each other through a wire 4b.

The above-described configuration can also obtain advantages similar to those of the configuration illustrated in FIG. 1. Moreover, in the configuration illustrated in FIG. 3, a plurality of semiconductor chips that are similar to or different from each other in plane size can be stacked without the constraint of the stacking sequence to realize the stacked CoC structure.

Figure 4:
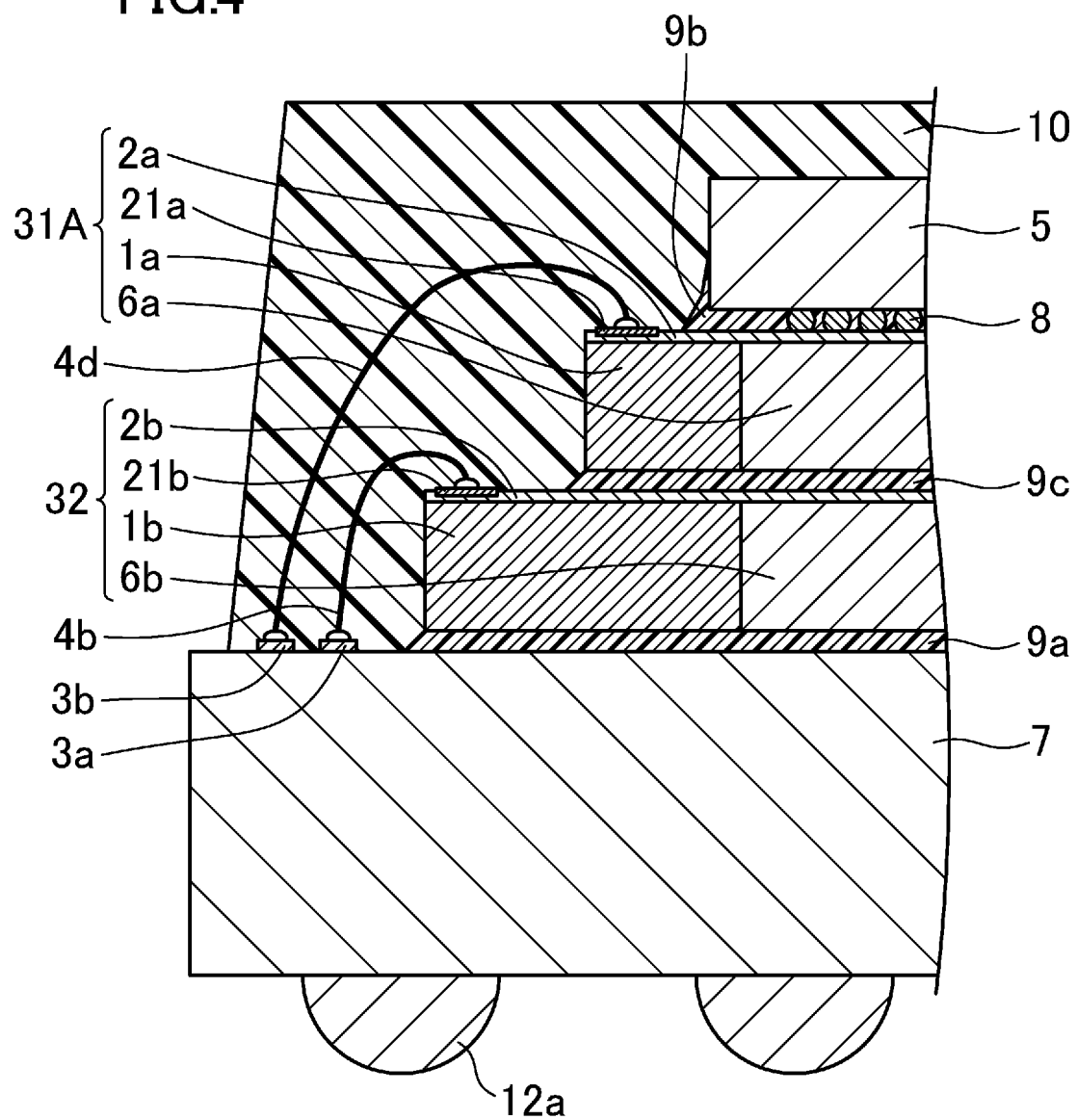
FIG. 4 is a sectional view illustrating an alternative example of the semiconductor device of the first embodiment.

Alternatively, as illustrated in FIG. 4, the extension electrode pad 21a may be connected through a wire 4d to a board electrode pad 3b, and the extension electrode pad 21b may be connected through the wire 4b to the board electrode pad 3a.

This configuration can also obtain advantages similar to those of the configurations illustrated in FIGS. 1 and 3. Moreover, in the configuration illustrated in FIG. 4, the extension advantageously does not need to have a large bonding pad region.

Figure 5:
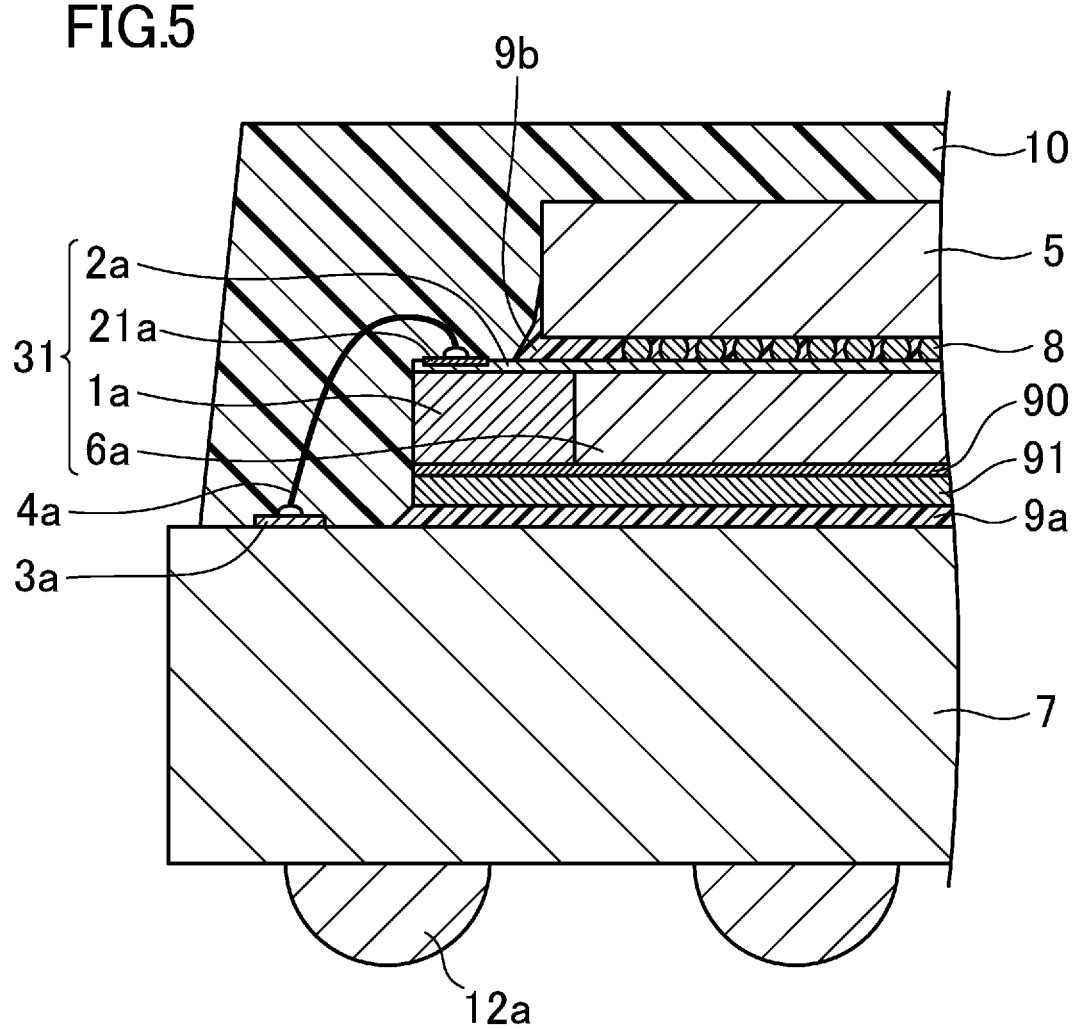
FIG. 5 is a sectional view illustrating an alternative example of the semiconductor device of the first embodiment.

FIG. 1 illustrates the example where the extended semiconductor chip 31 is bonded with the wiring board 7 by the underfill material 9a. Alternatively, as illustrated in FIG. 5, a flat bonding layer 91 may be disposed between the extended semiconductor chip 31 and the wiring board 7. The extended semiconductor chip 31 and the bonding layer 91 only have to be bonded with each other by an adhesive 90. The bonding layer 91 and the wiring board 7 only have to be bonded with each other by the underfill material 9a.

The bonding layer 91 that is disposed between the extended semiconductor chip 31 and the wiring board 7 can also obtain advantages similar to those obtained by the configuration shown in FIG. 1. In addition, the bonding layer 91 that is made of a material such as a metal etc. having high heat conductivity efficiently conducts heat generated in the extended semiconductor chip 31 to the wiring board 7 and the encapsulating resin 10, and enables this heat to dissipate to the outside of the semiconductor package. Moreover, the bonding layer 91 that is made of a material such as glass, silicon, etc. having high stiffness reduces the warpage of the semiconductor package, and improves the resistance to an impact that occurs when wire bonding is applied to the extension. In particular, these configurations are especially advantageous to the first chip 6a that is less than or equal to 100 μm in thickness, and the wiring board 7 that is less than or equal to 600 μm in thickness.

Note that, in the configurations illustrated in FIGS. 3 and 4, the bonding layer 91 may be disposed between the second extended semiconductor chip 32 and the wiring board 7. The bonding layer 91 may also be disposed between the first extended semiconductor chip 31A and the second extended semiconductor chip 32.

Figure 6:
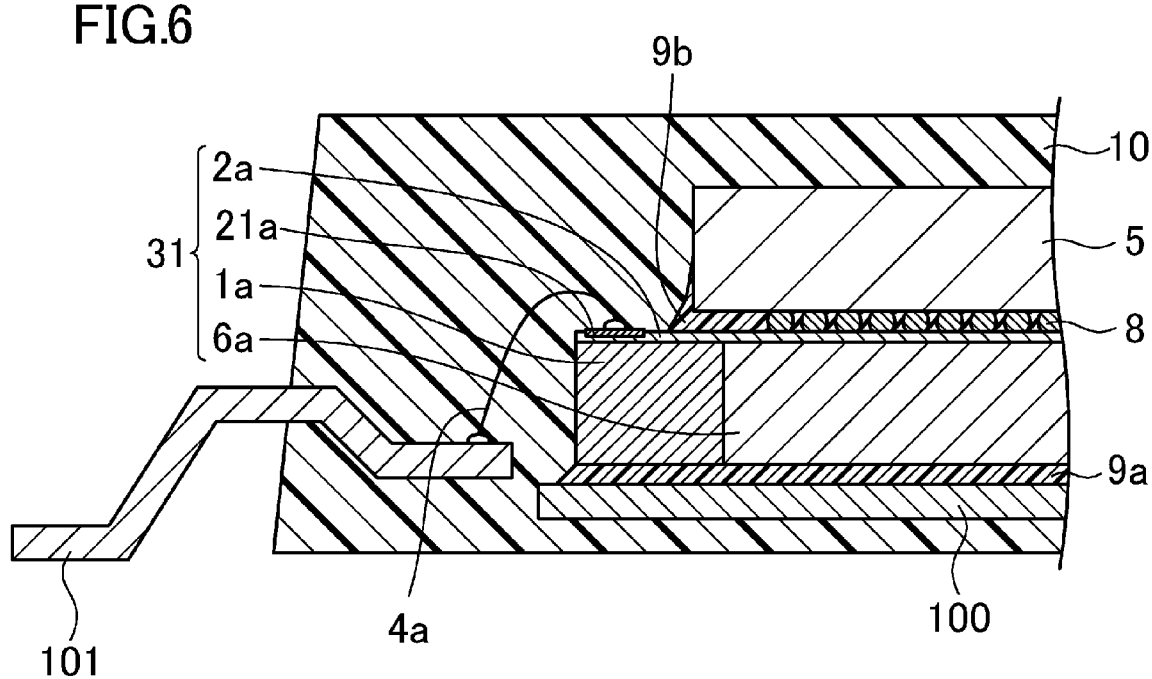
FIG. 6 is a sectional view illustrating an alternative example of the semiconductor device of the first embodiment.

FIG. 1 illustrates the example of the ball grid array (BGA) package using the wiring board. Alternatively, as illustrated in FIG. 6, the extended semiconductor chip 31 may be mounted above a die pad 100 of the lead frame, and a lead 101, serving as an outside electrode, and the extension electrode pad 21a of the extension 1a may be connected with each other through the wire 4a. Such a configuration can also obtain advantages similar to those of the configuration illustrated in FIG. 1. Moreover, the configuration illustrated in FIG. 6 adopts the lead frame more economical than the wiring board to reduce the cost of the semiconductor package.

Figure 7:
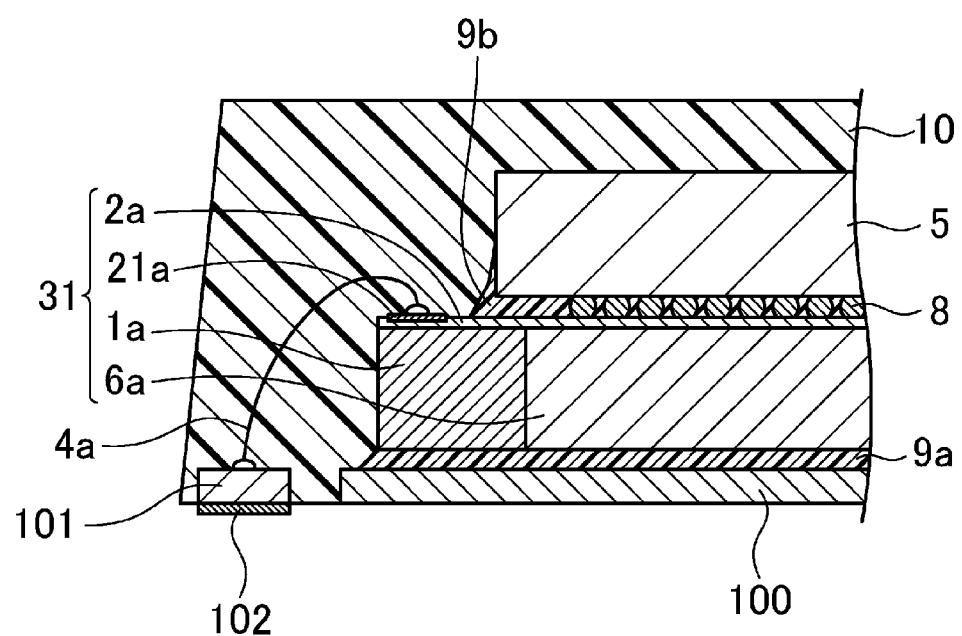
FIG. 7 is a sectional view illustrating an alternative example of the semiconductor device of the first embodiment.

Alternatively, as illustrated in FIG. 7, the extended semiconductor chip 31 may be mounted above the die pad 100 of the lead frame, and the outside electrode 102 may be provided on the back surface of the semiconductor package. This configuration can also obtain advantages similar to those of the configurations illustrated in FIGS. 1 and 6.

Note that, in a case where the wiring board is replaced with the lead frame, a plurality of extended semiconductor chips may be provided as illustrated in FIGS. 3 and 4. In addition, a bonding layer may be disposed between the extended semiconductor chip and the die pad.

Figure 8:
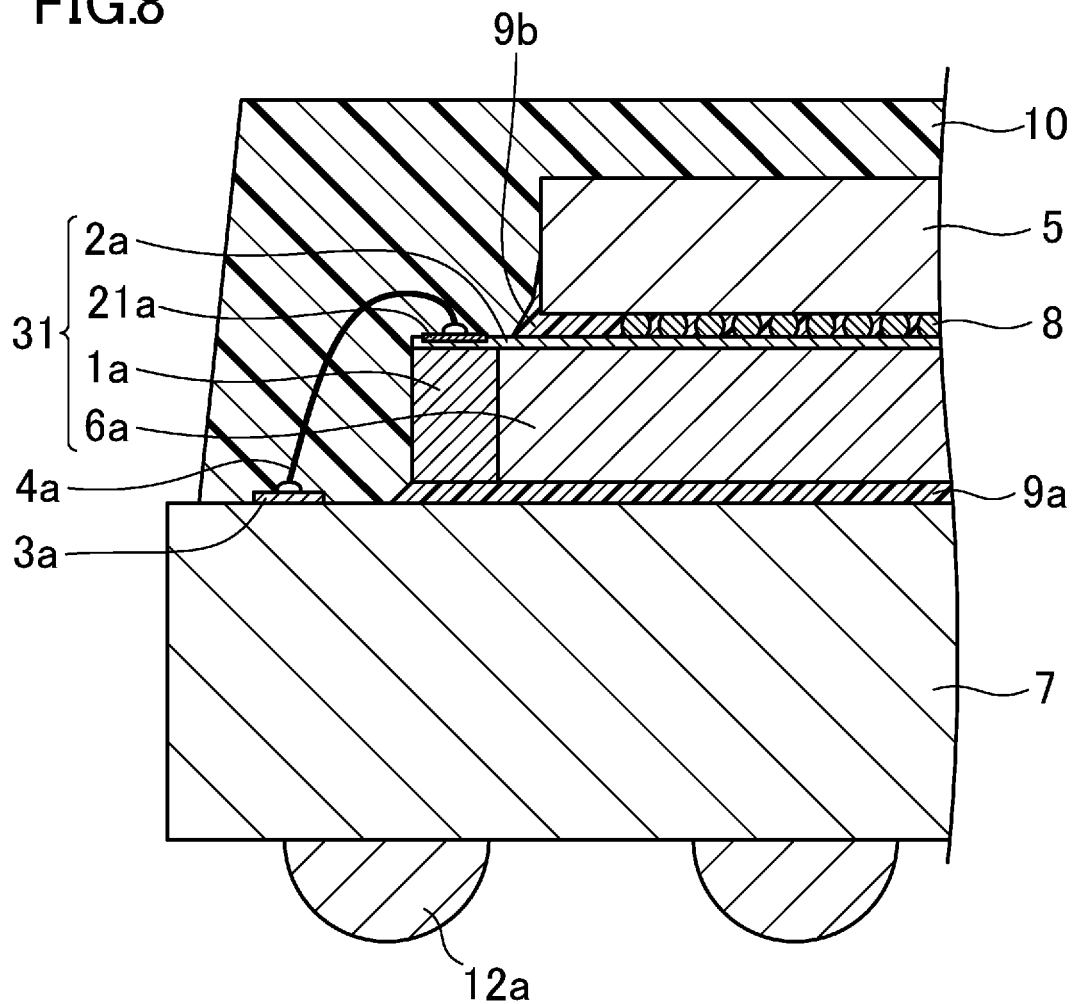
FIG. 8 is a sectional view illustrating an alternative example of the semiconductor device of the first embodiment.

FIGS. 1-7 illustrate the examples where the plane size of the first chip 6a is smaller than that of the second chip 5, and the side of the first chip 6a is shorter than that of the second chip 5. Alternatively, as illustrated in FIG. 8, the extension 1a is useful even for the first chip 6a that has the longer side than that of the second chip 5. The extension 1a can provide a sufficient area on the top surface of the extended semiconductor chip 31 that is not covered by the second chip 5.

The number of terminals of the lower semiconductor chip depends on the area of the region that is not covered by the upper semiconductor chip. Even if the difference between the areas of the lower and upper semiconductor chips is so small that the region where the terminals are disposed cannot be sufficiently obtained, the presence of the extension 1a enables the necessary number of the terminals to be provided. In addition, the distance in the horizontal direction (the direction along the principal surfaces of the semiconductor chips) between a side end of the upper semiconductor chip and a side end of the extended semiconductor chip is preferably more than or equal to 500 μm in consideration of bonding by a wire bonder. The presence of the extension 1a can obtain a sufficient horizontal distance between the side ends of the upper semiconductor chip and the extended semiconductor chip, and can ease bonding by a wire bonder. Similar advantages are obtained in a case where the size of the first chip 6a is the same as that of the second chip 5.

Figure 9:
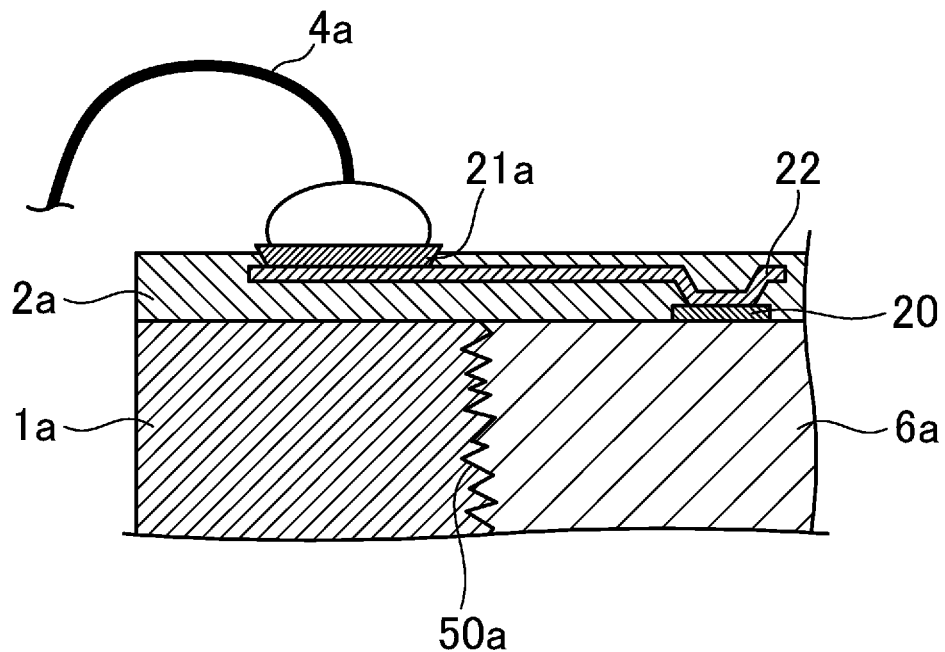
FIG. 9 is a sectional view illustrating an alternative example of the semiconductor device of the first embodiment.

FIG. 2 illustrates the example where the interface between the first chip 6a and the extension 1a is flat. Alternatively, as illustrated in FIG. 9, a side 50a of the first chip 6a may be raised and recessed so that the interface between the first chip 6a and the extension 1a is raised and recessed. The first chip 6a with the side raised and recessed allows a resin to bond the extension 1a and the first chip 6a, and can improve the adsorption.

Figure 10:
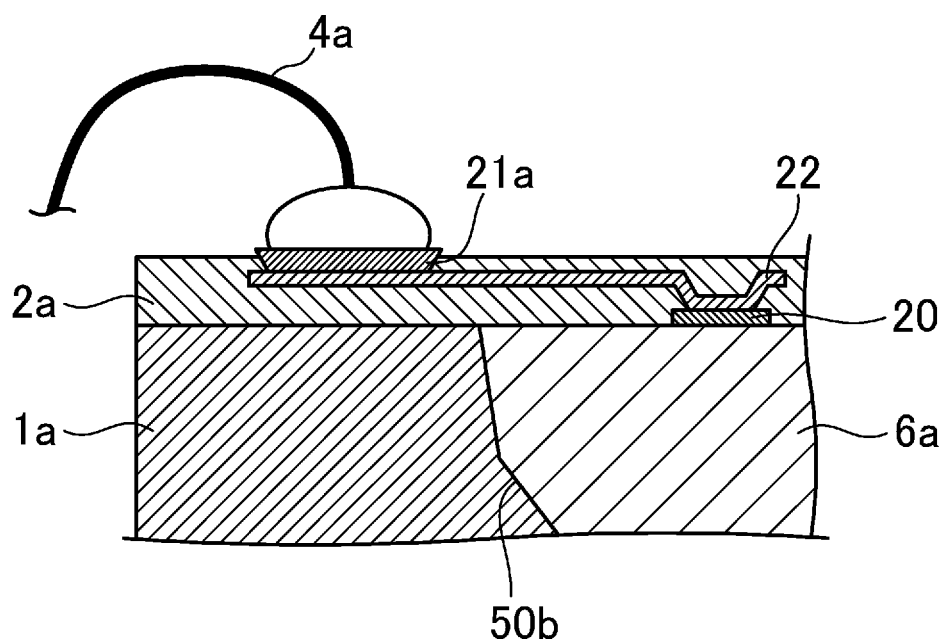
FIG. 10 is a sectional view illustrating an alternative example of the semiconductor device of the first embodiment.

Instead of the raised and recessed interface, as illustrated in FIG. 10, the first chip 6a may have a side 50b that is not vertical but tilted with respect to the top surface. Moreover, as illustrated in FIG. 10, the first chip 6a may have a plurality of tilted surfaces having different tilt angles. Such a configuration can increase the contact area between the first chip 6a and the extension 1a. This configuration is useful particularly when the first chip 6a is thin.

Figure 11:
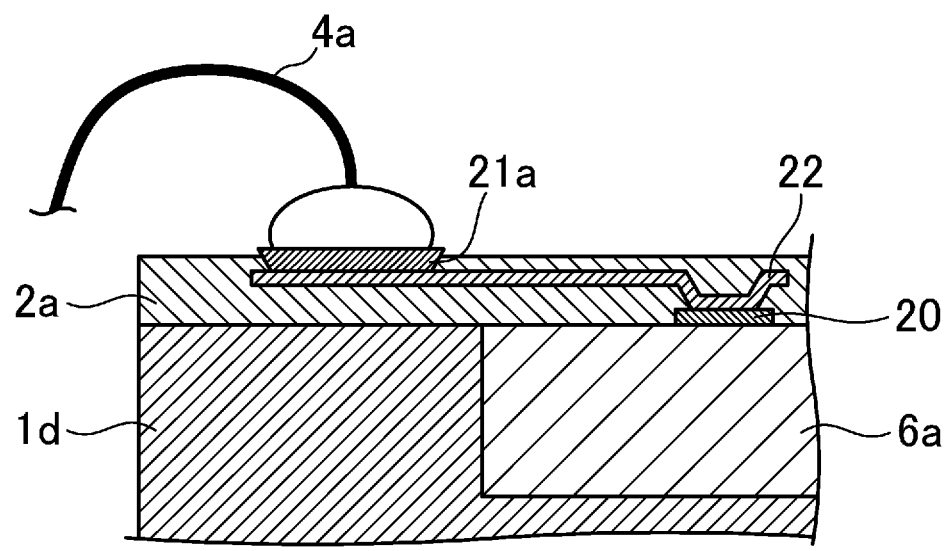
FIG. 11 is a sectional view illustrating an alternative example of the semiconductor device of the first embodiment.

Alternatively, as illustrated in FIG. 11, an extension 1d that covers the bottom surface of the first chip 6a may be provided. Such a configuration can ease formation of the extension 1d, and can increase the bonding strength.

Note that, these configurations of the interface between the first chip and the extension may be combined with each other. For example, while the first chip has the raised and recessed side, the extension may cover the bottom surface of the first chip. The first extended semiconductor chip has been described above. When a plurality of extended semiconductor chips are stacked instead, similar configurations can also apply to the other extended semiconductor chips. In addition, the semiconductor chip serving as an extended semiconductor chip may be not only a logic circuit chip but also another type of chip. The semiconductor chip stacked on the extended semiconductor chip may be also not only a memory chip but also another type of chip.

(Second Embodiment)

Figure 12:
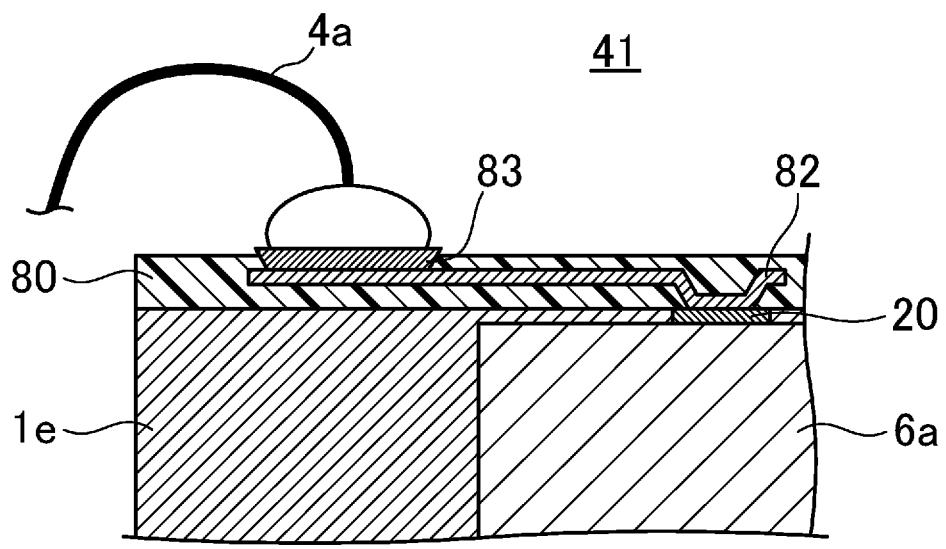
FIG. 12 is a sectional view of a semiconductor device of a second embodiment.

FIG. 12 is an enlarged view of a main portion of an extended semiconductor chip 41 of a semiconductor device of a second embodiment. The extended semiconductor chip 41 of this embodiment includes a first chip 6a that serves as a logic circuit chip. The extended semiconductor chip 41 of this embodiment also includes an extension 1e, which is made of a resin etc., and disposed on the periphery of the first chip 6a. An electrode 20, which is electrically connected with various elements contained in the first chip 6a, is disposed on the top surface of the first chip 6a. A top wiring board 80 is disposed and covers the first chip 6a and the extension 1e. An extension electrode pad 83 is disposed on the top wiring board 80. The extension electrode pad 83 and the electrode 20 are electrically connected with each other through a board wiring 82. The electrode 20 and the board wiring 82 are connected with each other through, e.g., bumps (not shown). The semiconductor device of this embodiment is characterized in that the electrode 20 of the first chip 6a and the extension electrode pad 83 disposed above the extension 1e are connected through the board wiring 82 instead of rewiring. In FIG. 12, only one board wiring 82 is disposed on the top wiring board 80. Alternatively, a plurality of board wiring layers may be disposed.

Similarly to FIG. 1, a second chip such as a memory chip etc. is stacked above the top wiring board 80 through bumps etc. The top wiring board 80 is larger than the first and second chips. The extension electrode pad 83 is electrically connected with a board electrode pad disposed on the wiring board through a wire 4a.

The top wiring board 80 is not specifically limited, but is preferably a bendable, flexible wiring board. In addition, the top wiring board 80 does not need to completely cover the first chip 6a and the extension 1e. The top wiring board 80 only has to electrically connect the extension electrode pad 83 disposed above the extension 1e with the electrode of the first chip 6a. Thus, the top surface of the first chip 6a may be exposed in a central portion of the extended semiconductor chip 41 so that the second chip is mounted directly on the first chip 6a.

Similarly to the semiconductor device of the first embodiment, such a configuration can realize the stacked CoC structure regardless of the size of the stacked semiconductor chips. In addition, the use of the wiring board can easily increase the number of wiring layers, and is useful particularly when many signal connections are required.

Note that, in the semiconductor device of this embodiment, a plurality of extended semiconductor chips may be stacked. This configuration may incorporate the extended semiconductor chips of the first embodiment. In addition, similarly to the first embodiment, the interface between the semiconductor chip and the extension that constitute the extended semiconductor chip may be, e.g., raised and recessed.

In the first and second embodiments, the extensions may be provided on not all of the four sides of the chip but only necessary sides. In addition, the extensions that are provided on multiple sides of the chip may not be equal in width to each other. For example, if the planer shape of the first chip is rectangular whose short sides are shorter than the corresponding sides of the second chip mounted above the first chip and whose long sides are longer than the corresponding sides of the second chip in plan view, the extension may be provided only on the long sides of the first chip to extend the short sides of the first chip.

The semiconductor device of the present disclosure does not depend on the size of the semiconductor chip. Semiconductor chips in this semiconductor device may be combined and stacked in a flexible manner. Moreover, it is not necessary to add a wiring layer on a lower semiconductor chip by a special process. Thus, the configuration of this semiconductor device can ease assembly of the semiconductor package and improve flexibility in combination of the stacked semiconductor chips. This semiconductor device is useful as a semiconductor device etc. particularly using the chip-on-chip technique.

What is claimed is:
1. A semiconductor device comprising:
a first extended semiconductor chip including a first semiconductor chip, and an extension attached to a side surface of the first semiconductor chip, the extension contacting and covering the side surface of the first semiconductor chip;
a plurality of first terminals disposed on a surface of he first extended semiconductor chip;
a second semiconductor chip including a plurality of second terminals, and mounted above the surface of the first extended semiconductor chip;
a third electrode disposed on the first semiconductor chip; and
a plurality of bumps electrically connecting the first terminals with the second terminals,
wherein the first extended semiconductor chip includes a first extension electrode pad provided above the extension, and electrically connected with the third electrode of the first semiconductor chip.
2. The semiconductor device of claim 1, wherein:
the first extended semiconductor chip includes a rewiring portion extending from a circumference of the first semiconductor chip to overlap a top surface of the extension, and
a wiring of the rewiring portion electrically connects the third electrode of the first semiconductor chip with the first extension electrode pad.
3. The semiconductor device of claim 1, wherein
a distance in a horizontal direction between a first side end of the first extended semiconductor chip and a second side end, corresponding to the first side end, of the second semiconductor chip is more than or equal to 500 μm.
4. The semiconductor device of claim 1, wherein
in a plan view, a location of a third side end of the first semiconductor chip is closer to a center of the first semiconductor chip than a location of a second side end, corresponding to the third side end, of the second semiconductor chip.
5. The semiconductor device of claim 1, wherein
a distance in a horizontal direction between a third side end of the first extended semiconductor chip and a second side end, corresponding to the third side end, of the second semiconductor chip is less than 500 μm.
6. The semiconductor device of claim 1, wherein
each side of the first extended semiconductor chip is substantially parallel with a corresponding side of the second semiconductor chip, and
a periphery of the first extended semiconductor chip is not covered by the second semiconductor chip.
7. The semiconductor device of claim 1, wherein
the extension is made of an insulating material.
8. The semiconductor device of claim 1, wherein
the second semiconductor chip is a memory chip.
9. The semiconductor device of claim 1, wherein
an interface between the extension and the first semiconductor chip is raised and recessed.
10. The semiconductor device of claim 1, wherein
the side surface of the first semiconductor chip in contact with the extension has a plurality of surfaces having different tilt angles.
11. The semiconductor device of claim 1, wherein
the plurality of first extension electrode pads are disposed in rows.
12. The semiconductor device of claim 1, further comprising:
a wiring board having a top surface on which the first extended semiconductor chip is mounted, wherein
the wiring board and the first extended semiconductor chip are bonded with each other by an adhesive layer, and
the first extension electrode pad is electrically connected with a board electrode pad disposed on the top surface of the wiring board.
13. The semiconductor device of claim 1, further comprising:
a lead frame including a chip mounting portion on which the first extended semiconductor chip is mounted, and a lead, wherein
the lead frame and the first extended semiconductor chip are bonded with each other by an adhesive layer, and
the first extension electrode pad is electrically connected with the lead through a metal wire.
14. The semiconductor device of claim 1, further comprising:
a second extended semiconductor chip including a third semiconductor chip and an extension extending outwardly from a side surface of the third semiconductor chip, and a wiring board, wherein
the second extended semiconductor chip is bonded on a top surface of the wiring board by an adhesive layer,
the first extended semiconductor chip IS mounted above the second extended semiconductor chip, and a second extension electrode pad disposed above the extension of the second extended semiconductor chip is electrically connected with a board electrode pad disposed on a top surface of the wiring board.

15. The semiconductor device of claim 5, wherein
in a plan view, a location of the third side end of the first semiconductor chip is farther from a center of the first semiconductor chip than a location of the second side end, corresponding to the third side end, of the second semiconductor chip.

16. The semiconductor device of claim 12, wherein
the extension electrode pad and the board electrode pad are connected with each other through a metal wire.

17. The semiconductor device of claim 12, wherein
the wiring board is a resin board.

18. The semiconductor device of claim 12, further comprising:
a flat bonding layer disposed between the first extended semiconductor chip and the wiring board.

19. The semiconductor device of claim 16, further comprising:
an encapsulating resin encapsulating the first extended semiconductor chip, the second semiconductor chip, and the metal wire.

20. A semiconductor device comprising:
a first extended semiconductor chip including a first semiconductor chip, and an extension attached to a side surface of the first semiconductor chip;
a plurality of first terminals disposed on the first extended semiconductor chip;
a second semiconductor chip mounted above the first extended semiconductor chip;
a plurality of second terminals disposed on a principal surface of the second semiconductor chip;
a third electrode disposed on the first semiconductor chip;
a plurality of bumps electrically connecting the plurality of first terminals of the first semiconductor chip with the plurality of second terminals of the second semiconductor chip;
a plurality of first extension electrode pads provided above the extension as wire bonding terminals; and
a rewiring portion extending from a circumference of the first semiconductor chip to overlap a top surface of the extension, and including a wiring electrically connecting the third electrode of the first semiconductor chip with the first extension electrode pads, wherein:
the rewiring portion is not disposed in a bonding portion between the first semiconductor chip and the second semiconductor chip, and
the first terminals and the bumps are connected with each other without the wiring of the rewiring portion.

21. The semiconductor device of claim 7, wherein
the insulating material is a resin.

* * * * *